(12) United States Patent
Weber et al.

(10) Patent No.: US 7,129,533 B2
(45) Date of Patent: Oct. 31, 2006

(54) HIGH CONCENTRATION INDIUM FLUORINE RETROGRADE WELLS

(75) Inventors: Cory E. Weber, Hillsboro, OR (US); Mark A. Armstrong, Portland, OR (US); Stephen M. Cea, Hillsboro, OR (US); Giuseppe Curello, Portland, OR (US); Sing-Chung Hu, San Jose, CA (US); Aaron D. Lilak, Hillsboro, OR (US); Max Wei, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 241 days.

(21) Appl. No.: 10/750,498

(22) Filed: Dec. 31, 2003

(65) Prior Publication Data

US 2004/0192055 A1  Sep. 30, 2004

Related U.S. Application Data

(62) Division of application No. 10/404,878, filed on Mar. 31, 2003, now Pat. No. 6,838,329.

(51) Int. Cl.
*H01L 29/80* (2006.01)

(52) U.S. Cl. ............ 257/285; 438/162; 438/217; 257/220

(58) Field of Classification Search ........ 257/220, 257/285; 438/217
See application file for complete search history.

(56) References Cited

U.S. PATENT DOCUMENTS

| | | | |
|---|---|---|---|
| 5,917,219 | A | 6/1999 | Nandakumar et al. |
| 6,180,468 | B1 * | 1/2001 | Yu et al. .................. 438/297 |
| 6,194,259 | B1 * | 2/2001 | Nayak et al. ............. 438/220 |
| 6,372,582 | B1 | 4/2002 | Rouse et al. |
| 6,534,373 | B1 * | 3/2003 | Yu ............................ 438/372 |
| 6,610,585 | B1 | 8/2003 | Brown et al. |
| 2003/0008462 | A1 | 1/2003 | Horiuchi et al. |
| 2004/0061187 | A1 | 4/2004 | Weber et al. |
| 2005/0167673 | A1 * | 8/2005 | Maegawa et al. ........... 257/72 |

* cited by examiner

*Primary Examiner*—Howard Weiss
*Assistant Examiner*—John Ingham
(74) *Attorney, Agent, or Firm*—Blakely, Sokoloff, Taylor & Zafman LLP

(57) ABSTRACT

A method and apparatus to form a high-concentration, indium-fluorine retrograde well within a substrate. The indium-fluorine retrograde well includes an indium concentration greater than about 3E18/cm3.

14 Claims, 14 Drawing Sheets

HIGH CONCENTRATION INDIUM FLUORINE RETROGRADE WELLS

This is a Divisional Application of U.S. patent application Ser. No. 10/404,878 filed Mar. 31, 2003 now U.S. Pat. No. 6,838,329.

FIELD

The present invention relates generally to the field of semiconductor technology and, more specifically, to indium doped transistors.

BACKGROUND

Improvement in MOS device technology is directly proportional to the rate at which MOS transistors can be scaled to increasingly smaller dimensions. Smaller CMOS architecture dimensions allows for more transistors to be included into integrated circuits, which in turn, leads to improved microprocessor performance. Conventional scaling of gate oxide thickness, source/drain extension (SDE), junction depths, and gate lengths have enabled MOS gate dimensions to be reduced from 10 µm in the 1970's to a present day size of 0.1 µm.

Practical scaling limits, however, are being reached for known technology. Consequently additional techniques, such as channel engineering, have been proposed for improving electrical properties of the transistor channel. One such technique is known as retrograde well engineering. Retrograde well engineering includes creating a particular doping profile ("well") in the channel region of a transistor that affects the distribution of the electric field inside the transistor channel. Retrograde wells have been used to increase transistor drive without causing an increase in the off-state leakage current of the transistor. FIG. 1 illustrates a NMOS transistor 100 with a retrograde well 102 according to the prior art. The retrograde well 102 is typically formed by inserting a slow diffusing p-type dopant species such as indium (In) into a surface of a substrate 103 in an area corresponding to the channel region of the transistor 100. The device is then formed including typical structures such as source/drain regions 104, gate dielectric 106, gate electrode 108, and spacers 110.

Indium has the advantage of maintaining a concentration profile that is retrograde to the surface of the substrate even after substantial annealing. This retrograde profile results in improved electrical characteristics, such as a lower threshold voltage for the transistor compared to fast-diffusing p-type dopants, such as boron, that typically form non-retrograde wells after significant annealing. FIG. 2 illustrates a retrograde indium profile 202 for a conventional NMOS retrograde well. The indium profile 202 illustrates that the indium dopant concentration increases in the downward direction to a peak 204 of 1E18/cm3 at around 200 angstroms (Å) below the substrate surface, then decreases as the profile extends deeper into the substrate surface. The retrograde contour is essential to provide for an optimally minimal threshold voltage and an optimally minimal off-state leakage current.

In the current art, indium solubility in a silicon substrate is limited to, at best, about 3e18/cm3, which is approximately the concentration required to support off-state leakage currents for about a 90 nm gate. However, to support higher dopant levels for next generation gate lengths, 60 nm or below, higher dopant levels are required, or in other words, indium needs to have a higher concentration than 3e18/cm3, which is conventionally impossible to create.

Simply using more indium does not work. During activation, the substrate can only hold a certain amount of indium before becoming saturated with excess indium molecules, causing the excess indium to diffuse, thus forming a concentration profile similar to the indium profile 206 illustrated in FIG. 2. The concentration profile 206 is not retrograde, thus resulting in an undesirably high threshold voltage for the transistor and, at best, the indium concentration is still only about 3E18/cm3 at the desired depth below the substrate surface.

BRIEF DESCRIPTION OF THE DRAWINGS

Embodiments of the present invention are illustrated by way of example and should not be limited by the figures of the accompanying drawings in which like references indicate similar elements and in which.

DETAILED DESCRIPTION

Described herein is a method and apparatus for a high concentration indium fluorine retrograde well. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well-known semiconductor fabrication processes, techniques, materials, equipment, etc., have not been set forth in particular detail in order to not unnecessarily obscure embodiments of the present invention.

Briefly, the method includes forming the high concentration indium-fluorine retrograde well by utilizing indium in conjunction with fluorine. More specifically, fluorine atoms are mixed with a high concentration of indium atoms inside the substrate before an annealing activation. After the annealing activation, the indium concentration in the retrograde well remains high, or in other words greater than 3E18/cm3, yet still possesses a retrograde profile. Consequently, the channel for an NMOS transistor can have a retrograde well with both a high p-type dopant concentration in the channel and a strong retrograde profile. Furthermore, the gate length of the transistor can be scaled below 60 nm, and have a desirably low threshold voltage and a low off-state leakage current.

Figure 1:
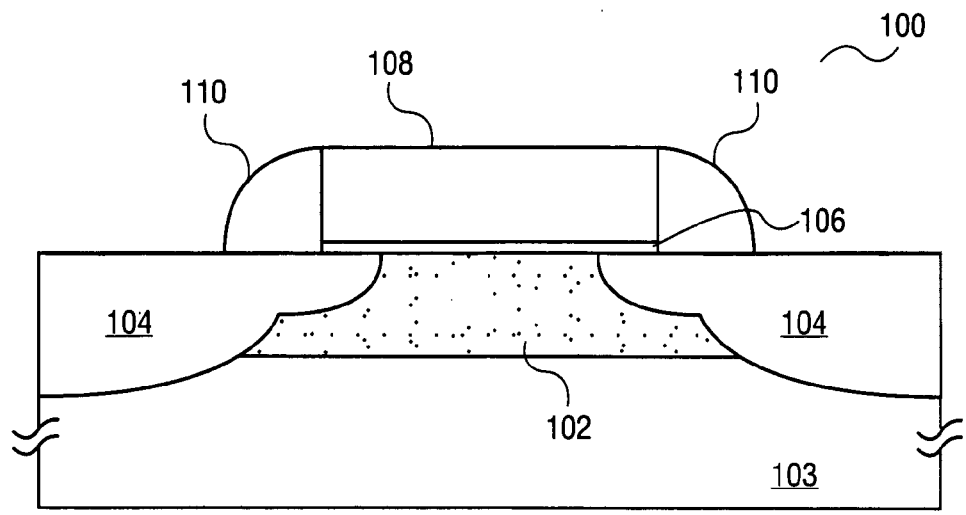
FIG. 1 illustrates a transistor with a retrograde well according to the prior art.
Figure 2:
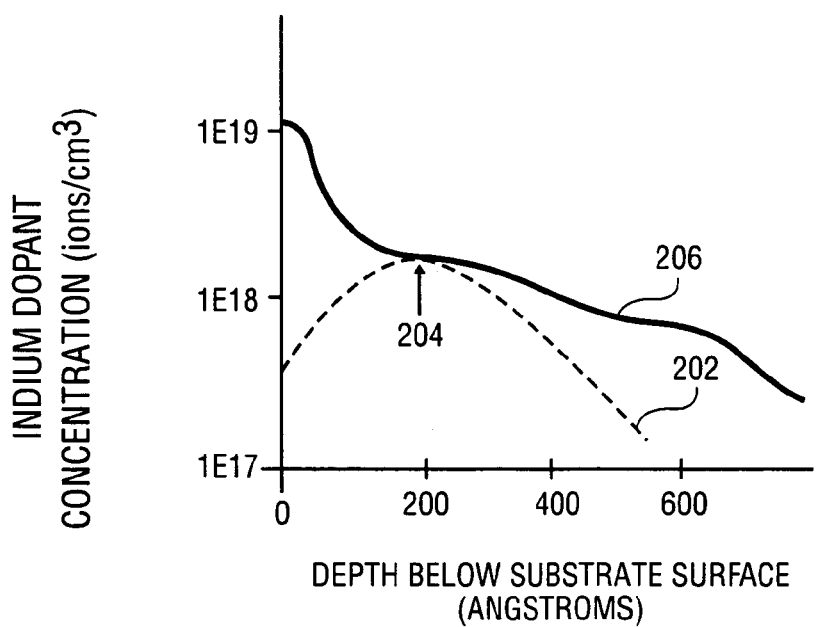
FIG. 2 illustrates a retrograde indium profile for a conventional NMOS indium retrograde well.
Figure 3:
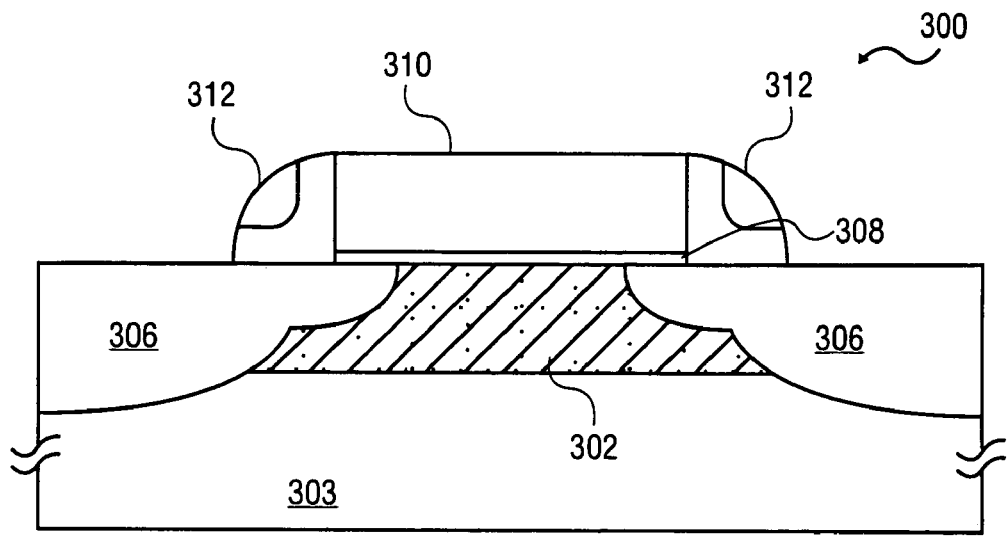
FIG. 3 illustrates an NMOS transistor including a high concentration indium fluorine ("In/F") retrograde well, according to one embodiment of the invention.

FIG. 3 illustrates an NMOS transistor 300 including a high concentration indium fluorine ("In/F") retrograde well 302. Referring to FIG. 3, transistor 300 includes the In/F retrograde well 302 formed into a substrate 303. The transistor may also include source/drain (S/D) regions 306, a gate dielectric 308, a gate electrode 310, and spacers 312. The In/F retrograde well 302 includes both indium and fluorine. The concentration of the indium inside the retrograde well can be much grater than the conventional limit of $3E18/cm^3$.

Figure 4A:
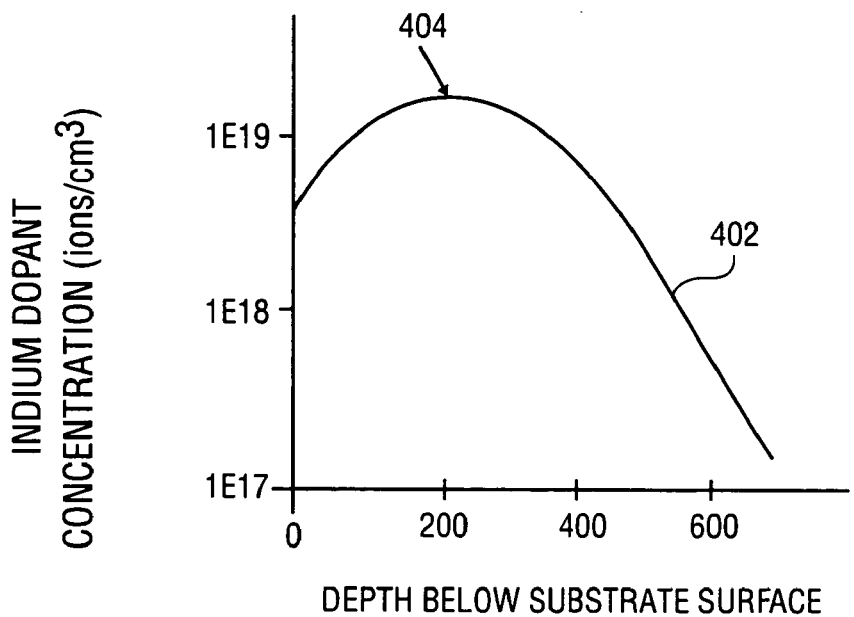
FIG. 4A illustrates the indium concentration profile for an In/F retrograde well, according to one embodiment of the invention.

FIG. 4A illustrates the indium concentration profile for the In/F retrograde well 302 according to one embodiment of the invention. Referring to FIG. 4A, the indium profile 402 begins at the surface of a substrate. The concentration increases deeper into the substrate surface until reaching a concentration peak 404 slightly below the substrate surface. The concentration peak 404 is about 1E19/cm3 (or approximately 3 times greater than $3E18/cm^3$) at a depth of around 200 Angstrom (Å) below the substrate surface. Still referring to the indium profile 402 in FIG. 4A, after the peak 404 the indium concentration decreases deeper into the substrate surface until eventually the indium concentration reaches negligible amounts.

The retrograde shape of the profile allows for less indium dopant concentration near the substrate surface, thus resulting in less ionized impurity scattering, allowing for a higher drive current than if the profile peak were at the surface.

The presence of fluorine in the In/F retrograde well 302 is a result of the method described in further detail in conjunction with FIG. 5A-5J below or FIG. 6A-6E below. The fluorine allows the substrate 303 to hold the indium in concentration levels above 3E18/cm3 during annealing. If no fluorine were included in the retrograde well, during annealing the indium would diffuse to a maximum concentration of about 3E18/cm3. Experimental data, as illustrated in FIG. 4A, shows that, in one embodiment of the invention, the presence of fluorine allows for more than three times as much indium dopant in the retrograde well 302, or 1E19 indium atoms/cm3. However, there is no upper limit to the amount of concentration that can be included in the In/F retrograde well, thus NMOS devices may be made having indium concentrations even higher than 1E19/cm3.

Thus, embodiments of the present invention allow for indium concentration within the substrate greater than conventionally possible. The increased amount of indium inside the channel region allows for a higher electrical field within the channel region during operation, hence better conductivity and gate control, thus allowing the gate length to be scaled below 60 nm.

Figure 4B:
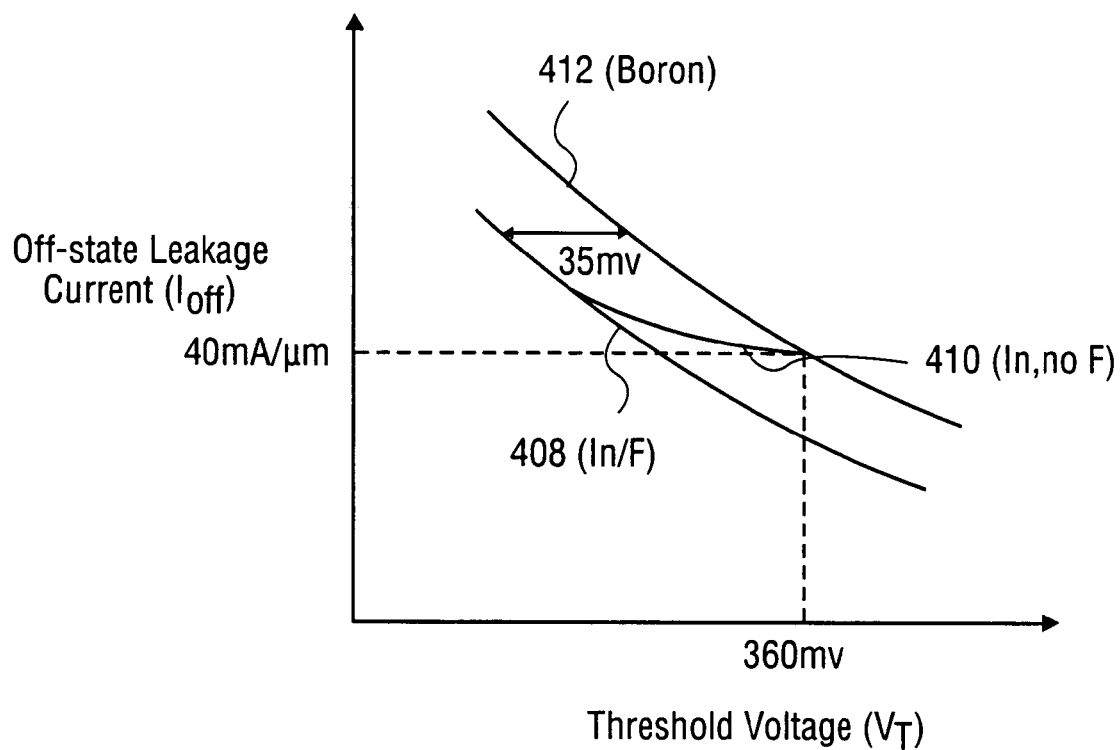
FIG. 4B illustrates a graphical comparison of off-state leakage current compared to threshold voltage for an NMOS transistor according to one embodiment of the invention.

FIG. 4B illustrates a graphical comparison of off-state leakage current compared to threshold voltage for an NMOS transistor according to one embodiment of the invention. Referring to FIG. 4B, the threshold voltage 408 for a device with an In/F retrograde well is consistently lower, (approximately 35 mV lower) than the threshold voltage 412 available for conventional non-retrograde p-type devices, such as for a device doped with a boron implant. The threshold voltage 408 for a device with an In/F retrograde well is also consistently lower than the threshold voltage available for an indium retrograde well without fluorine, as shown in graph 410. Additionally, because of the concentration limit on an indium retrograde well without fluorine ("In, no F"), as the In, no F device is scaled smaller, requiring a higher threshold voltage, the highest possible threshold voltage is about 360 mV, where the In, no F device ceases to have any improvement over a conventional, non-retrograde, Boron doped device. In other words, the limit to the indium concentration of the In, no F device at 3E18/cm3, also causes a limit to maximum possible threshold voltage, or about 360 mV.

Figure 5A:
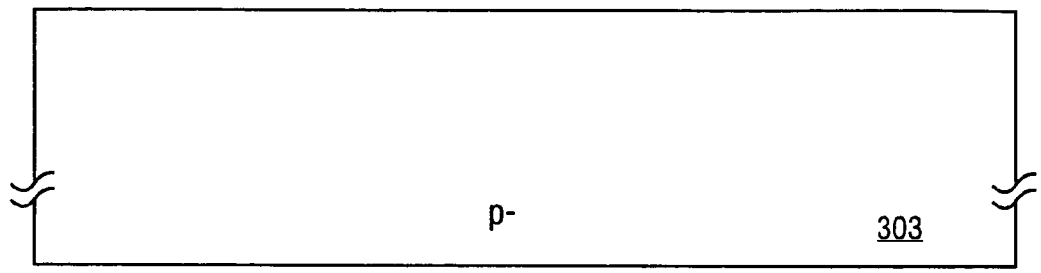
FIG. 5A-5J illustrate a method, according to one embodiment of the invention, of forming an NMOS transistor with an In/F retrograde well.

FIG. 5A-5J illustrates a method, according to one embodiment of the invention, of forming the NMOS transistor 300 described above. Referring first to FIG. 5A, substrate 303 is formed. In one embodiment of the invention, the substrate 303 includes any form (e.g., bulk, epitaxial) of monocrystalline silicon. The substrate may be lightly doped with a p-type dopant, for example boron, to a desired concentration, such as approximately 1E16/cm3. The substrate 303, however, may also encompass other layers or structures, not shown, that comprise one or more insulative, semi-insulative, conductive, or semiconductive materials.

Figure 5B:
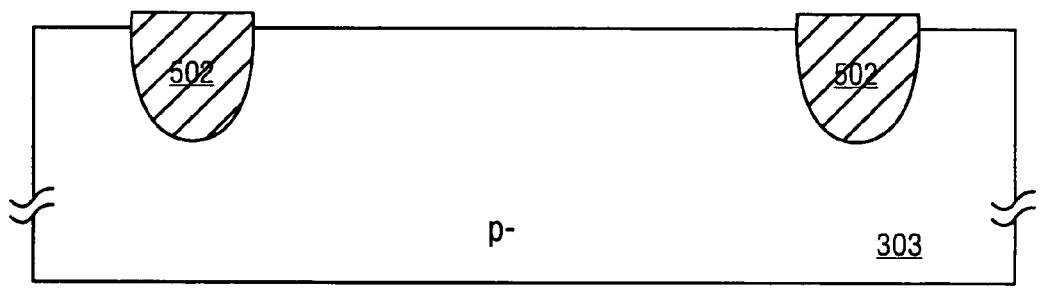

The method may continue by forming isolation regions 502 into the top surface of the substrate 303, as shown in FIG. 5B. The isolation regions 502 may be formed according to any known technique of forming electrically insulating structures within a substrate including trench isolation, field-oxide growth, or other known techniques. The isolation regions 502 are to electrically isolate devices that will be subsequently formed on the substrate. In one embodiment of the invention, the isolation regions 502 are formed by a well-known shallow trench isolation (STI) procedure The result is shown in the cross sectional diagram of FIG. 5B. The cross section of FIG. 5B, and subsequent illustrations herein, illustrate the formation of a transistor along the gate length.

Figure 5C:
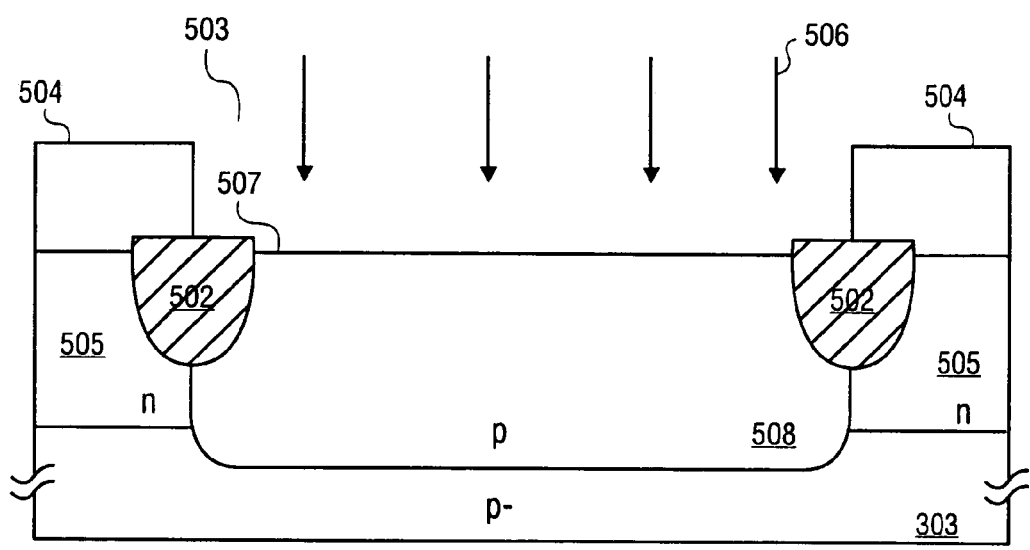

The method may continue, as shown at FIG. 5C, with the formation of a p-type well 508 ("p-well"). The formation of the p well may include forming and patterning a photoresist layer 504 according to well known photoresist deposition, masking, exposing, and developing techniques, to have an opening 503 defining portions of the substrate 303 that are to be exposed to a p-type dopant 506. The photoresist layer 504 covers adjacent portions 505 of the substrate 303 that are to either side of the isolation regions 502 that should not be exposed to the p-type dopant. According to one embodiment of the invention, the p-type dopant may include boron (B) and may be implanted at an angle of 90° vertical to the surface 507 of the substrate 303, at a dose of about 2.5e13/cm2 at an energy of about 225 keV. The energy of the boron implant should be high enough so that the boron peak is far enough from the substrate surface 507 so that the boron does not affect the threshold voltage of the device. Hence, in one embodiment of the invention, the boron peak should be at least 500 Å from the substrate surface 507, and is typically about 3000 Å from the substrate surface 507.

In one embodiment of the invention, the adjacent portions 505 may have been previously doped, or subsequently doped, with n-type impurities to form n-type wells ("n-wells") according to a twin-well, CMOS process. Though not shown, the n-wells may be formed by a similar technique as that of the p-well 508 including covering the p-well 508 and exposing the adjacent portions 505 to an n-type dopant. PMOS devices may thus be formed on the n-wells. Formation of PMOS devices, however, is not described herein and may follow known conventional methodology.

Figure 5D:
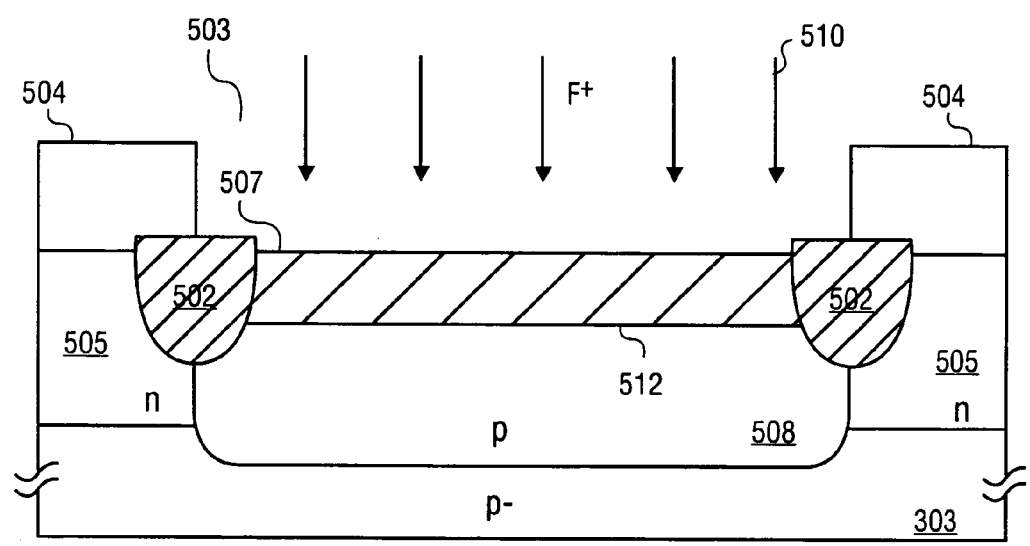
Figure 5E:
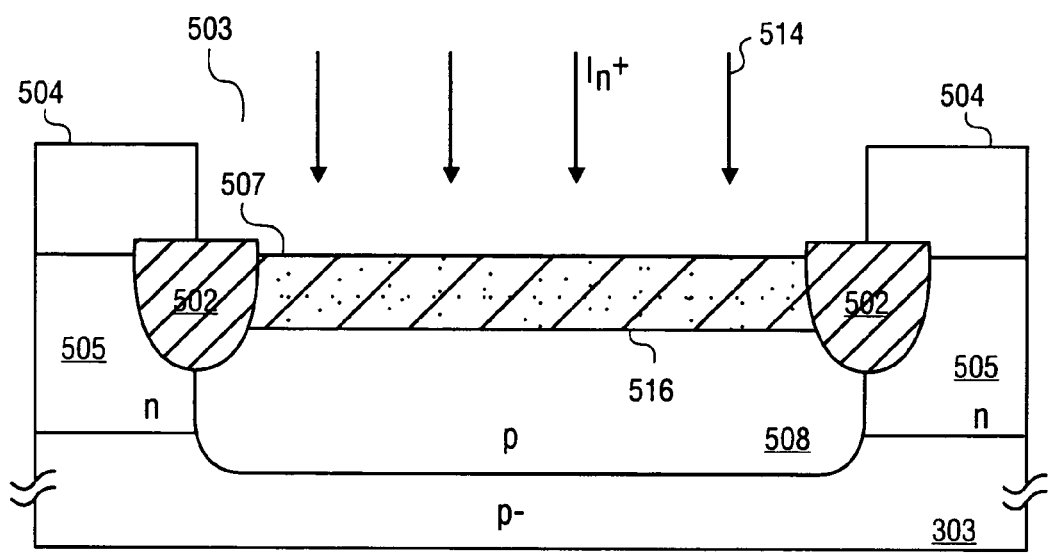

The method may continue, as shown in FIG. 5lD and FIG. 5E respectively, with implanting the surface 507 of the substrate 303, through the opening 503, with fluorine ions 510 followed by implanting the surface 507 of the substrate 303 with indium ions 514, also through opening 503. The photoresist layer 504 protects the adjacent portions 505 from being exposed to the fluorine ions 520 and the indium ions 514. The opening 503 allows the fluorine ions 510 to be implanted into the substrate surface 507 into the entire region between the isolation regions 502. Other embodiments of the invention, however, may include forming the opening 503 to be smaller so that only a portion of the region between the isolation regions 502 are implanted.

Referring specifically to FIG. 5D, the fluorine ions 510 are implanted into the substrate surface 507, to form a region 512 containing fluorine ions embedded near the substrate surface 507. As shown in FIG. 5D, the fluorine ions are implanted at an angle normal to (approximately 90° to) the substrate surface 507, however the angle does not necessarily have to be normal and can vary, for example, by approximately 45 degrees from normal. The target depth of the fluorine implantation is whatever depth may be desired. In one embodiment of the invention, the fluorine 510 is implanted to a target depth of approximately 200 Å, or deeper, below the substrate surface 507. However, during subsequent processing steps, the fluorine may diffuse into the substrate 303 by more than 200 Å. The fluorine ions are implanted at a dose above about 2E14/cm2, preferably within the range of about 2E14–2E15/cm2. The implantation energy may be between about 5 keV to about 25 keV, preferably at an energy of about 10–12 keV. A dosage amount lower than 2E14/cm2 may be insufficient to prevent subsequently implanted indium ions from excessively diffusing during a subsequent activation anneal. On the other hand, the fluorine dose may be higher than 2E15/cm2, however 2E15/cm2 is a practical upper limit for the fluorine dose since little benefit is seen with higher amounts of fluorine. Additionally, although higher amounts than 2E15/cm2 may be utilized, such amounts tend to cause undesirable defects and clusters.

Referring next to FIG. 5E, the indium ions 514 are implanted into the substrate surface 507, to form a fluorine/indium mixture 516 to a shallow depth below the substrate surface 507. In FIG. 5E, the indium ions 514 are implanted at an angle normal to (approximately 90° vertical to) the substrate surface 507, however other angles may be utilized. The fluorine/indium mixture 516 contains indium ions mixed with fluorine ions. The target depth of the indium implantation is whatever depth is desired, and is approximately the same depth as the depth of the fluorine implant. In one embodiment of the invention, the indium 514 is implanted to a depth of approximately 200 Å, or deeper, below the substrate surface 507. Therefore, in one embodiment of the invention, the indium profile is retrograde to the substrate surface 507 with a concentration peak at about 200 Å below the substrate surface 507.

The indium ions 514 are implanted at a dose above about 2E13/cm2, preferably within the range of about 2E13–3E14/cm2. The implantation energy may be above about 30 keV, preferably within a range of about 30–100 keV. An indium dose amount lower than 2E13/cm2 is insufficient to produce a desired indium concentration, after annealing, above about 3e18/cm3. In one embodiment, a dose of about 4E13/cm2 and energy of about 50 keV will allow for an indium concentration about three times greater than 3E18/cm3, or about 1E19/cm3. However, there is no experimentally known upper limit to the dose amount of indium that may be implanted since the fluorine inside the fluorine/indium mixture 516 will prevent indium diffusion, regardless of the indium amount, thus allowing for indium concentration even greater than 1E19/cm3. The higher the indium dose, the greater the indium concentration, which will allow for a higher threshold voltage and, thus, will allow for the device gate length to be made smaller. In one embodiment, for a gate length of about 60 nm, a concentration of about 1e19/cm3 indium is sufficient. However, for smaller gate lengths, such as at 30 nm, a higher concentration of indium may be required. Currently, the lower limit for the gate length is experimentally undetermined, but theoretically can be as low as 0 nm.

In the embodiments shown in FIG. 5D and FIG. 5E, the fluorine is implanted before the indium only for purposes of illustration. In other embodiments of the invention, the fluorine may be implanted at the same time or after the indium. In other words, there is no benefit to implanting one before the other. It is, however, important that both be implanted, and mixed together, before the indium sees substantial annealing, or in other words, before the indium is exposed to a temperature above 700° C.

Figure 5F:
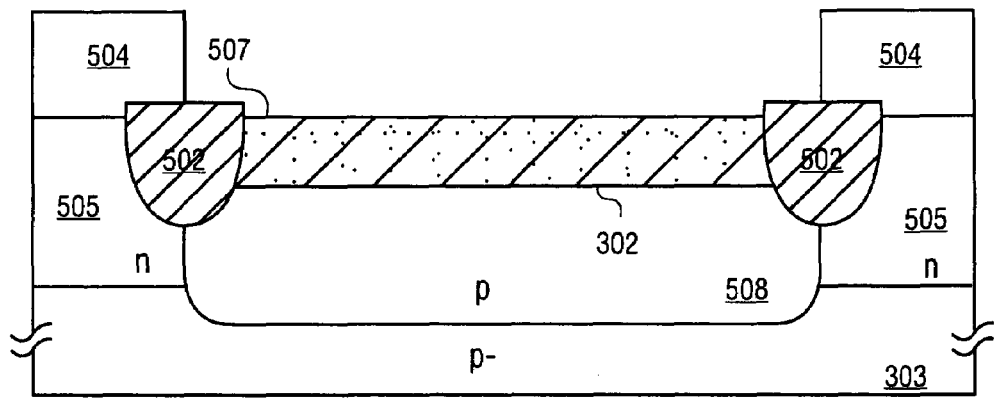

The method may then continue, as shown in FIG. 5F, with annealing the indium-fluorine mixture 516 to activate the indium ions thus forming an activated indium/fluorine retrograde well 302 ("In/F well") having a retrograde indium profile with a concentration peak that is greater than 3E18/cm3. During the anneal, the fluorine ions prevent the indium ions from substantially diffusing into the substrate 303 as would occur if no fluorine were present.

More specifically, though not completely understood, it is believed that the fluorine prevents the indium from substantially diffusing during the anneal by inhibiting the indium atoms from pairing with damaged substrate atoms that normally would diffuse during the anneal. In other words, normally when indium atoms are implanted, the indium atoms tend to displace substrate atoms causing damaged substrate atoms. After a certain amount of indium has been implanted, the indium atoms begin to pair with the damaged substrate atoms so that during annealing any paired indium atoms will diffuse. However, when fluorine is introduced, according to various embodiments of the invention, it is believed that the fluorine atoms trap the damaged substrate atoms, so that during annealing the damaged substrate atoms do not pair with indium. Therefore, the indium does not diffuse away during annealing.

Still referring to FIG. 5F, to fully activate the indium, the anneal includes a temperature increase to above about 700° C. for a time sufficient to activate the indium atoms within the substrate 303. Full activation occurs when the ionized indium concentration, normalized to the indium dose, is approximately at unity. If annealed for too long, or at too high a temperature, the indium will diffuse and be less retrograde. According to one embodiment of the invention, the anneal may be a Rapid Thermal Process (RTP) anneal in a nitrogen environment at a temperature of between 900° C.–1200° C. for about 0.1 to 300 seconds, including a spike anneal at about 1080° C. for about 0.25 seconds. Subsequent activation anneals may be performed during the fabrication process, however additional diffusion of the indium will occur. Hence, in one embodiment of the invention, the activation anneal may be performed later, such as during a subsequent source/drain activation anneal to limit indium diffusion.

The result is an activated, high concentration In/F well 302 having a high indium concentration. The term "high concentration" is a relative term and is herein utilized to indicate an indium concentration above about 3E18/cm3 and a fluorine concentration between about 5E18/cm3 to about 3E20/cm3. In one embodiment of the invention, the activated indium profile has been measured to have a concentration at about 1E19/cm3 after annealing, which is three times greater than the conventional indium concentration of only about 3e18/cm3. In another embodiment of the invention, the peak concentration for the activated In/F well may be obtained as high as 1E20/cm3, however, even higher amounts are theoretically obtainable according to other embodiments of the invention. Additionally, the profile of the indium concentration has a peak that is just below the substrate surface, at about 200 Å in one embodiment of the invention. Consequently, the In/F retrograde well 302 may more aptly be described as a "shallow" well to distinguish it from a "deep" well, such as the p-well 508.

Figure 5G:
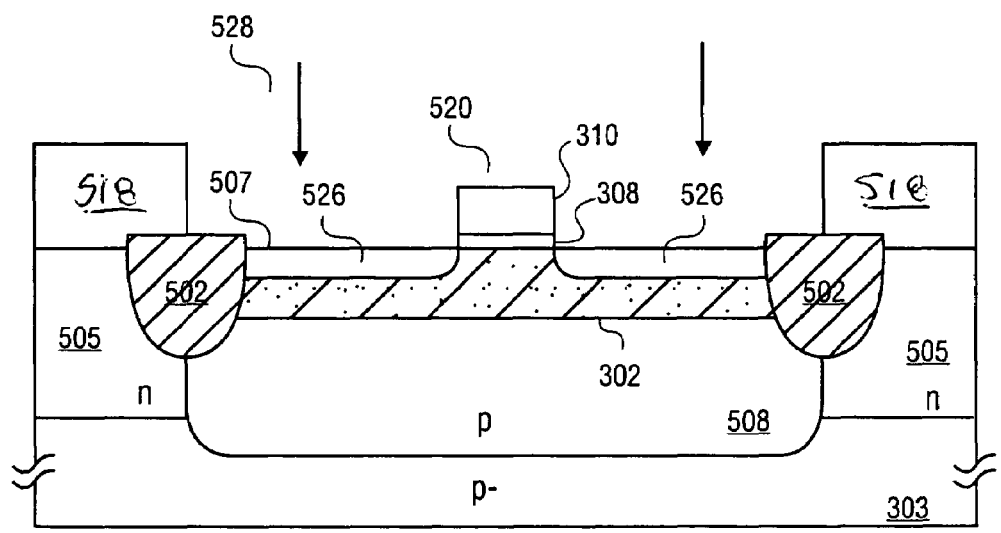

The method may continue, as shown in FIG. 5G-5J with removing photoresist mask 504 and subsequently forming at least one gate structure above the In/F well 302. FIG. 5G-5J specifically shows a single gate process where one NMOS transistor is formed, however other embodiments of the invention may include the formation of more than one NMOS transistor between the isolation regions 502. Referring to FIG. 5G, a gate structure 520 is formed on the substrate surface according to known methods. The gate structure 520 includes a gate dielectric 308 and a gate electrode 310. The gate dielectric 308 may be formed from any insulative material used for insulating the gate electrode 310 from the substrate 303 and from source/drain regions to be subsequently formed into the substrate surface. In one embodiment of the invention, the gate dielectric 308 may be silicon oxide (e.g., $SiO_2$). However, the formation of a silicon oxide gate dielectric that is too thick may cause the injection of interstitials (silicon atoms) into the substrate 303 causing the indium within the In/F well 302 to diffuse, thus greatly reducing the benefit of forming the In/F well 302 with fluorine atoms. Hence, to reduce the amount of interstitials, and thus minimize the amount of indium diffusion, it would be desirable to limit the total silicon oxide growth to about 30 Å after the indium and fluorine implantations. In other embodiments of the invention, however, the gate dielectric 308 may comprise a material with a dielectric constant (k) substantially higher than the dielectric constant of silicon dioxide (i.e., higher than k=3.9). Exemplary "high-k" materials used in the formation of integrated devices include metal oxides, ferroelectrics, amorphous metal silicates, amorphous silicate oxides, and paralectrics. Such "high-k" dielectric materials may also be limited in formation to about 30 Å after the indium and fluorine implantations. The gate electrode 310 may comprise any conductive material, such as any one of, or a combination of, metal, metal compound, polysilicon, amorphous silicon, or other known conducting or semiconductor materials. In the embodiment of the invention shown in FIG. 5G, the gate electrode 310 comprises polycrystalline silicon that will subsequently be heavily doped to improve conductivity.

Still referring to FIG. 5G, a photolithography process may be performed according to well known techniques, to form another photoresist layer 518 with an opening 528 through which a source/drain tip implant may be performed to form source/drain extensions 526. In one embodiment of the invention, the tip implant may include implanting an n-type dopant 524 into the surface 507 of the substrate 303 to form shallow source/drain extensions 526. The n-type dopant 524 may also be implanted into the gate electrode 310. The photoresist layer 518 protects the adjacent portions 505 from being exposed to the n-type dopant 524. In one embodiment of the invention, the n-type dopant may be arsenic (As) and may be implanted at an approximate 90° vertical angle, at a dose of about 1.6e15/cm2. The implant energy should be low, about 4 keV to 10 keV, to ensure that the shallow source/drain extensions 526 are formed to a shallow depth. According to one embodiment of the invention, after implantation and diffusion, the source/drain extension 526 should be about two times (2×) shallower than the peak of the I/F well 302, hence implantation energies and annealing procedures should be considered accordingly.

After the n-type dopant 524 has been implanted, the resultant source/drain extensions 526 are in alignment with the outside edges of the gate structure 520. Therefore, a rapid thermal process (RTP) anneal may be performed to cause the source/drain extensions 526 to diffuse slightly underneath the gate dielectric 308, and slightly further into the substrate 303. One ordinarily skilled in the art, however, will recognize that other techniques may be performed to implant the source/drain extensions 526 so that the n-type dopant 524 is implanted beneath the gate structure 520 without the need for an RTP anneal, such as implanting the n-type dopant 524 at an angle other than a vertical 90°.

Figure 5H:
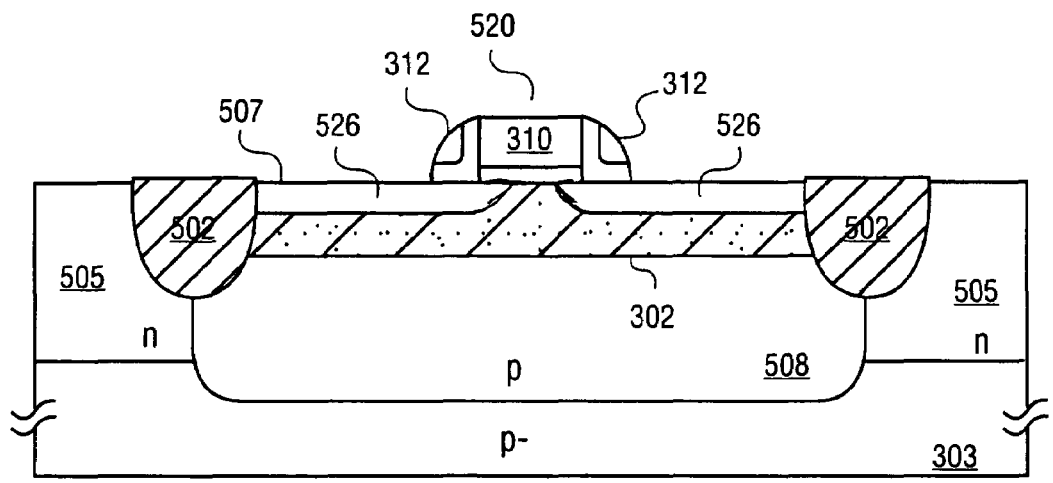
Figure 5I:
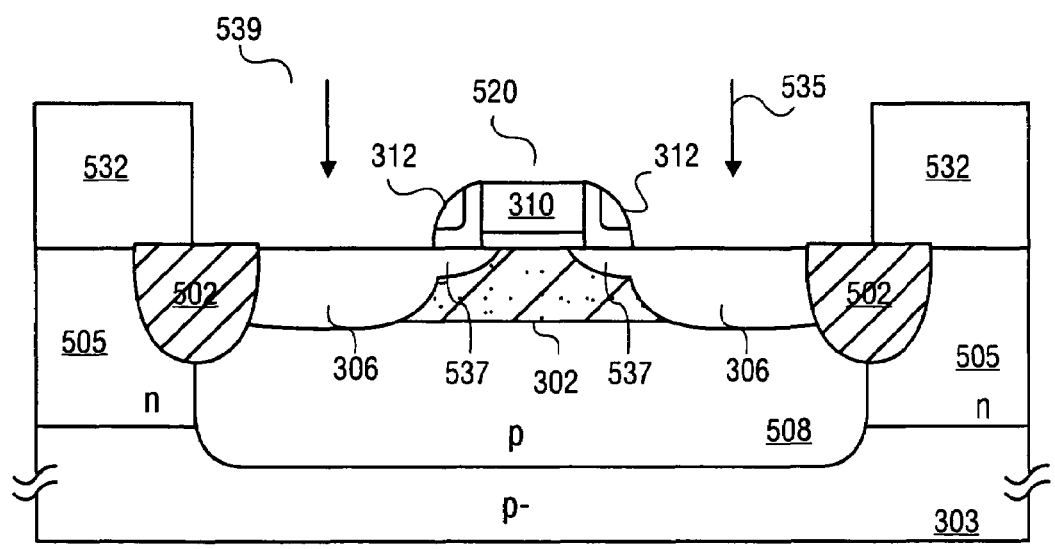

Next, the method may continue, as shown in FIG. 5I, with removing the photoresist mask 518 and forming thick spacers 312 adjacent to, and touching the entire side-wall length, of the gate structure 520. The thick spacers 312 should comprise a material that will prevent a subsequent high dosage implant from interfering with the lightly doped portion of the source/drain extension 526 below the thick spacers 312. For instance, the thick spacers may consist of a nitride, or a combination of a nitride and an oxide, as shown in FIG. 5H. The thick spacers 312 ensure that a subsequent deep implant does not disturb the source/drain extension 526 underlying the thick spacers 312. Consequently, the thick spacers 312 should be formed thick and wide enough to prevent the subsequent deep, high dose ion implantation, described in FIG. 5H, from overwhelming the portion of the source/drain extensions 526 underneath the thick spacers 312.

Another photoresist layer 532 may subsequently be formed having an opening 539 through which a deep source/drain implant may be performed to form deeply doped source/drain regions 306. The deep source/drain implant may include implanting an n-type dopant 535 at a dose and energy higher than that for the tip implant. For example, the dopant may comprise As implanted at a dose of about 8.0e15/cm2 and an energy of about 50 keV. The thick spacers 312 protect the source/drain extensions 526 beneath thick spacers 312 from being exposed to the deep source/drain implant, thus resulting in doped source/drain tips 537 and deeply doped source/drain regions 306. The source/drain tips 537 are merely the remnants of the source/drain extensions 526 and comprise the same lightly doped n-type material. In one embodiment of the invention, the deep regions 306 are formed to a concentration of between $1\times10^{19}/cm3-5\times10^{20}/cm3$ and a depth of approximately 300 Å to 2500 Å. The deeply doped source/drain regions 306 and the polysilicon gate electrode 310 are exposed to the deep source/drain implant, thus deeply doping the polysilicon gate electrode 310.

A source/drain activation anneal may then be performed to activate the n-type dopants in the deep source/drain regions 306, the tips 537, and the polysilicon gate electrode 310. In one embodiment of the invention, the activation anneal may include an RTP anneal in a nitrogen environment at a temperature of between 900° C.–1200° C. for about 0.1 to 300 seconds, including a spike anneal at about 1080° C. for about 10 seconds. The rapid temperature ramp of the spike anneal enables good dopant activation with minimal source/drain and tip junction diffusion.

Figure 5J:
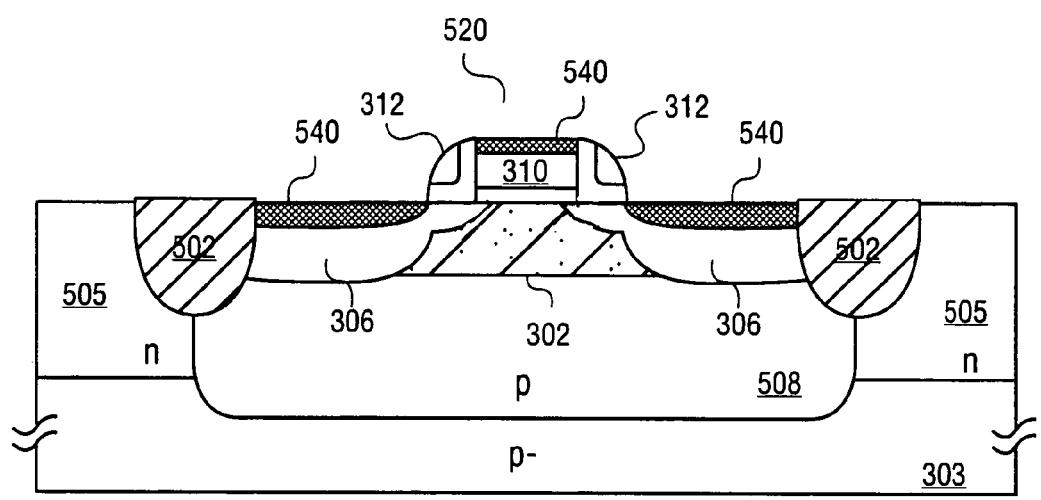

The method may also include, as shown in FIG. 5J, silicidizing the top portions of the deep source drain regions 306 and the top of the electrode 310. In one embodiment of the invention, a silicidation process may include forming a cobalt silicide (CoSi2) 540 over the deep source/drain regions 306 and over the polysilicon gate electrode 310. Metal contacts may subsequently be formed to contact the silicide 540 during subsequent processing.

Figure 6A:
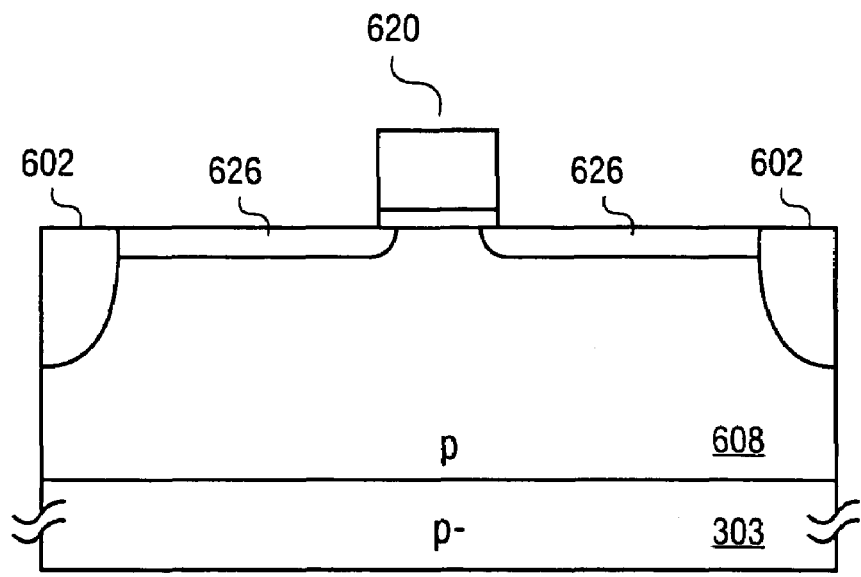
FIG. 6A-6E illustrate a method according to another embodiment of the invention of forming an NMOS transistor device with an In/F retrograde well.

FIG. 6A-6E illustrate a method according to another embodiment of the invention of forming an NMOS transistor device with an In/F retrograde well. The method begins, as shown at FIG. 6A, with forming isolation regions 602 into a substrate 303 and forming a deep p-well 608 between the isolation regions 602. After forming the deep p-well, the method may also include forming a gate structure 620 between isolation regions 602 and over the p-type well 608 on the substrate 303. After forming the gate structure 620, n-type source/drain tip implants 626 may then be formed into the substrate surface on either side of the gate structure 620. The gate structure 620, the p-type well 608, the isolation regions 602, and the substrate 303 are substantially the same as accompanying counterparts described above in FIG. 5A-5I above, however the fluorine implantation of FIG. 5D, the indium implant of FIG. 5E, and the activation anneal of FIG. 5F have not yet occurred.

Figure 6B:
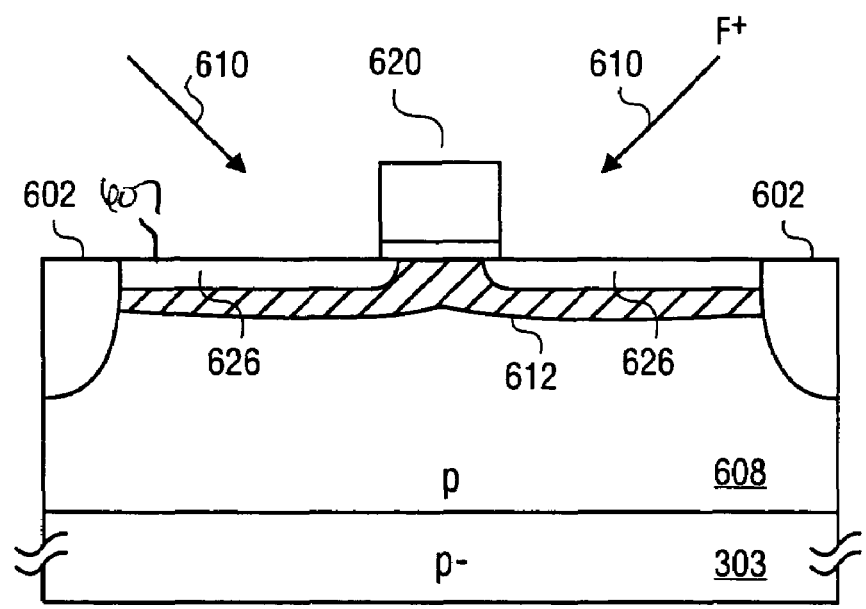
Figure 6C:
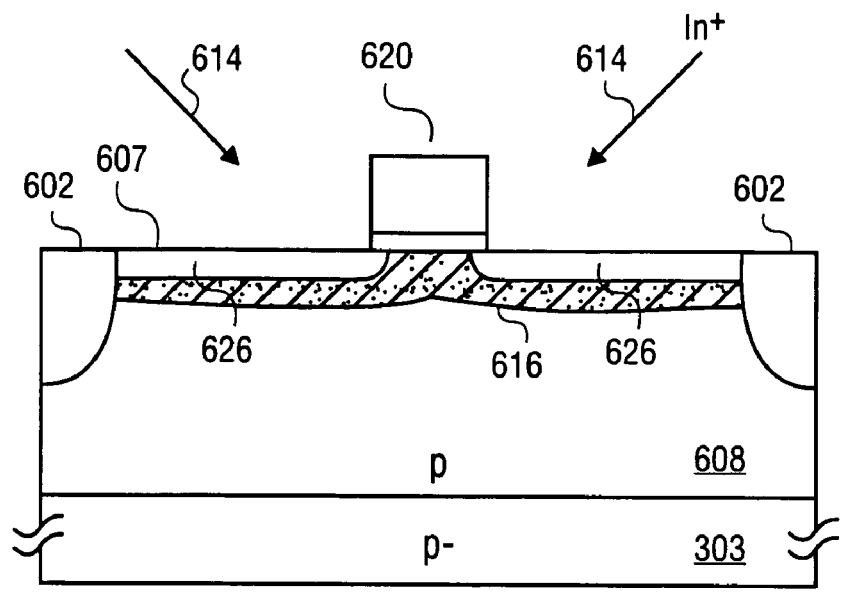

The method may then continue, as shown in FIG. 6B-6C, with implanting fluorine ions 610 and indium ions 614, at an angle, into the surface of the silicon substrate 303 beneath, and on both sides of, the gate structure 620. According to some embodiments of the invention, as shown in FIG. 6B-6C, for transistors with short gate lengths (about 60 nm), because the gate length is so small, the fluorine ions 610 and indium ions 614 can be implanted along the entire gate length of the gate structure 620. However, in other embodiments of the invention, for transistors with long gate lengths (about 1 μm), the fluorine ions 610 and the indium ions 614 may only be implanted underneath the corners of the channel, on either sides of the gate structure 620, not along the entire gate length of the gate structure 620.

Referring to FIG. 6B, fluorine ions are implanted from either side of the gate structure 620, at opposing angles, and with an energy sufficient to implant fluorine ions into the surface of the silicon substrate 303 underneath, and along the entire gate length of the gate structure 620. The same range of doses and energies may be utilized as described above in conjunction with FIG. 5D, except that as shown in FIG. 6B, the implant is angled to approximately 20° to 40° from the substrate surface 607 to form halo implants 612 comprising fluorine atoms. The halo implants 612 overlap in the area underneath the gate structure 620 so that the implanted fluorine ions 612 are implanted uniformly deep.

Next, as shown in FIG. 6C, the indium ions 614 are implanted at an approximate 20° to 40° angle from the substrate surface at the same doses and energies described above in conjunction with FIG. 5E to form an indium/fluorine ion mixture 616 having an indium concentration peak at approximately 200 Å, or deeper, below the substrate surface 607. The indium/fluorine mixture 616 extends through the entire under-portion of the gate structure 620. One advantage of halo implanting after the gate structure 620 has been formed is that the effect of interstitials is reduced since the indium 614 is implanted after the gate dielectric of the gate structure 620 is formed.

Figure 6D:
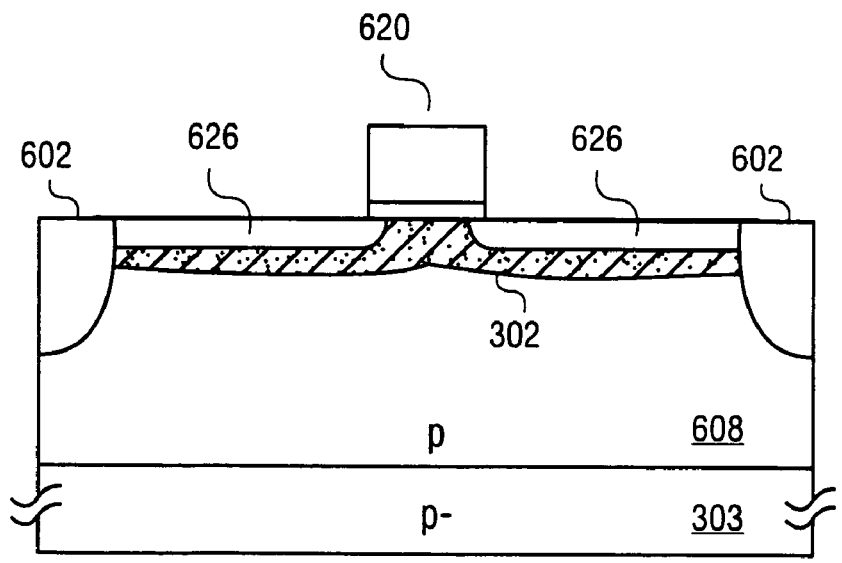

After implanting the fluorine and the indium ions, an activation anneal may be performed, as shown in FIG. 6D, to fully activate the indium atoms, thus forming an activated, high concentration In/F retrograde well 302. During annealing, the fluorine prevents the indium from substantially diffusing, thus allowing an indium retrograde profile with a concentration peak greater than about 3E18/cm3. In one embodiment of the invention, the concentration peak is at least at least three times greater than 3E18/cm3, or about 1E19/cm3. The activation anneal may be performed essentially as described above in conjunction with FIG. 5F. In other embodiment of the invention, however, to minimize the total amount of annealing, the activation anneal to fully activate the indium atoms may be performed later, such as during a subsequent source/drain activation anneal.

Figure 6E:
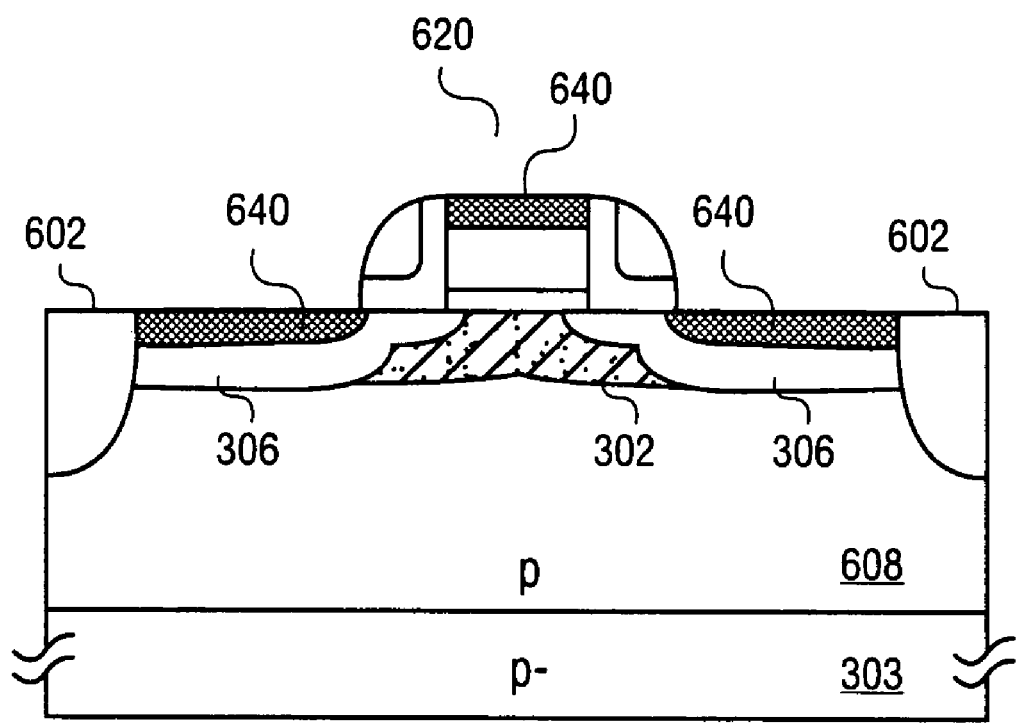

Subsequently, the method may continue, as shown in FIG. 6E, with forming deep source/drain regions 306 and silicide regions 640 essentially as described above in conjunction with FIG. 5G-5I.

Figure 7:
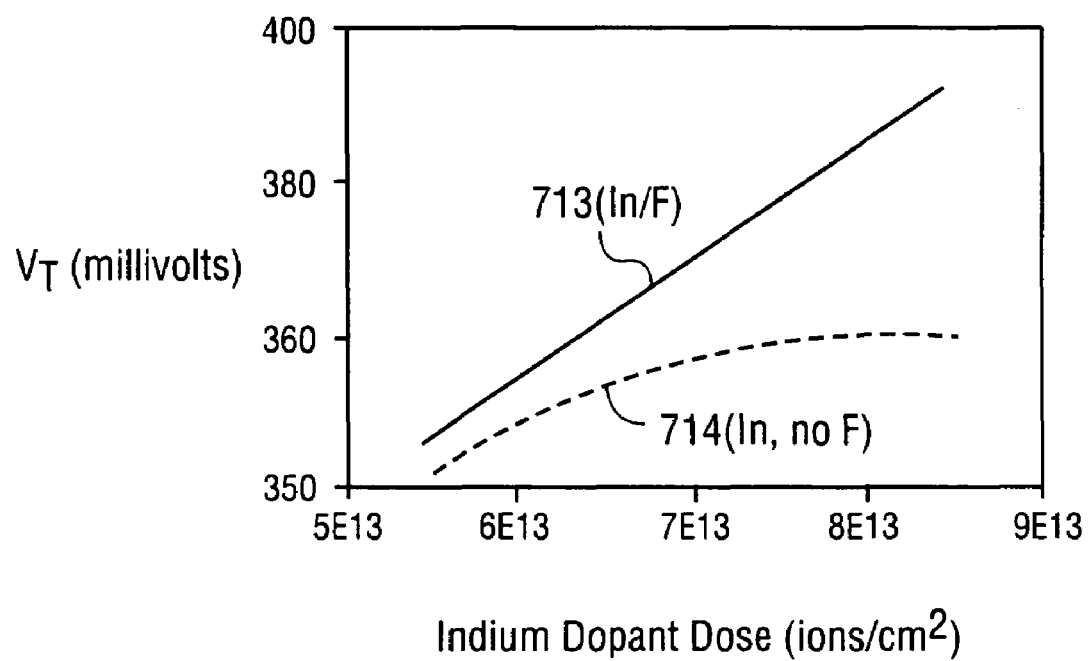
FIG. 7 illustrates a graph of threshold voltage (Vt) versus indium dopant dose (In dose) for an In/F implant compared to a Vt versus In dose for an In, no F implant.

FIG. 7 illustrates a graph of threshold voltage (Vt) versus indium dopant dose (In dose) for a In/F implant compared to a Vt versus In dose for an In, no F implant. All dosages shown in FIG. 7 relate to a transistor device having an approximate 40 nA/μm off-state leakage current. Furthermore, all dosages include comparatively equal implantation energies so that the dosage amounts relate essentially to indium amount. Referring to FIG. 7, the threshold voltage 713 for a device having a retrograde In/F well increases upward, thus allowing a transistor device to have higher concentrations of indium, and consequently, lower gate dimensions. The threshold voltage 714 for a device having a retrograde In well without implanted fluorine ("In, no F"), however, is limited in the effect of the solubility of indium, and consequently, the threshold voltage 714 for such a device cannot continue increase as does threshold voltage 713. The reason for this phenomenon, as described earlier, is that indium can be implanted to high dosages within the substrate, but during annealing, the substrate will not hold it all, and the excess indium from the dose will diffuse out, resulting in a maximum indium concentration of about 3E18/cm3. Therefore, beyond a certain indium dosage (shown as around 7.5E13/cm2 in FIG. 7), there is no increase to the threshold voltage 714 for the device without fluorine. To the contrary, however, according to embodiments of the invention described herein, when fluorine ions are implanted along with an indium dopant, the indium dopant dosage allows the threshold voltage for the In/F device to continue to increase and therefore, indium doses beyond 7.5E13/cm2 can be utilized effectively.

Several embodiments of the invention have thus been described. However, those ordinarily skilled in the art will recognize that the invention is not limited to the embodiments described, but can be practiced with modification and alteration within the spirit and scope of the appended claims that follow.

What is claimed is:

1. An integrated circuit, comprising:
   an indium-fluorine retrograde well inside a substrate, the indium-fluorine retrograde well including an indium concentration greater than about 3E18/cm3.

2. The integrated circuit of claim 1, wherein the indium-fluorine retrograde well includes an indium concentration three times, or more, greater than 3E18/cm3.

3. The integrated circuit of claim 1, wherein the indium-fluorine retrograde well includes a fluorine concentration between about 5E18/cm3 to about 3E20/cm3.

4. The integrated circuit of claim 1, wherein the indium-fluorine retrograde well includes an indium concentration peak at about 200 Å, or deeper, below the substrate surface.

5. An integrated circuit, comprising:
a substrate;
a gate structure formed on the substrate; and
an indium-fluorine retrograde well formed to a shallow depth below a surface of the substrate and beneath the gate structure.

6. The integrated circuit of claim 5, comprising an indium concentration above about 3E18.

7. The integrated circuit of claim 5, wherein the indium-fluorine retrograde well includes an indium concentration three times, or more, greater than 3E18/cm3.

8. The integrated circuit of claim 5, wherein the indium-fluorine retrograde well includes a fluorine concentration between about 5E18/cm3 to about 3E20/cm3.

9. The integrated circuit of claim 5, wherein the indium has a concentration peak at about 200 Å, or deeper, below the substrate surface.

10. An integrated circuit, comprising:
a gate structure overlying a silicon substrate;
source/drain regions inside the silicon substrate, the source/drain regions adjacent to opposing sides of the gate structure and extending slightly underneath the gate structure; and
a fluorine-indium retrograde well directly beneath the gate structure and between the source/drain regions, the fluorine-indium retrograde well including an indium concentration greater than 3E18/cm3.

11. The integrated circuit of claim 10, wherein the fluorine-indium retrograde well is to provide a threshold voltage greater than about 360 mV.

12. The integrated circuit of claim 10, wherein the fluorine-indium retrograde well includes an indium concentration peak at about 200 Å, or deeper, below the substrate surface.

13. The integrated circuit of claim 10, wherein the gate structure has a gate length of about 60 nm or less.

14. The integrated circuit of claim 10, wherein the fluorine-indium retrograde well includes an indium concentration three times, or more, greater than 3E18/cm3.

* * * * *